United States Patent
Roh

(10) Patent No.: US 11,784,661 B2
(45) Date of Patent: Oct. 10, 2023

(54) METHOD FOR COMPRESSING BEHAVIOR EVENT IN COMPUTER AND COMPUTER DEVICE THEREFOR

(71) Applicant: Somma, Inc., Seongnam-si (KR)

(72) Inventor: Yonghwan Roh, Yongin-si (KR)

(73) Assignee: Somma, Inc., Seongnam-si (KR)

( * ) Notice: Subject to any disclaimer, the term of this patent is extended or adjusted under 35 U.S.C. 154(b) by 507 days.

(21) Appl. No.: 17/122,261

(22) Filed: Dec. 15, 2020

(65) Prior Publication Data
US 2021/0194501 A1    Jun. 24, 2021

(30) Foreign Application Priority Data

Dec. 18, 2019   (KR) .................. 10-2019-0169817
Nov. 23, 2020   (KR) .................. 10-2020-0157671

(51) Int. Cl.
*H03M 7/30*   (2006.01)
*G06F 9/54*   (2006.01)
*G06F 17/18*   (2006.01)

(52) U.S. Cl.
CPC ............ *H03M 7/60* (2013.01); *G06F 9/542* (2013.01); *G06F 17/18* (2013.01); *H03M 7/3091* (2013.01); *H03M 7/70* (2013.01)

(58) Field of Classification Search
CPC ........ H03M 7/60; H03M 7/3091; H03M 7/70; G06F 9/542; G06F 17/18
USPC .......................................................... 341/50
See application file for complete search history.

(56) References Cited

U.S. PATENT DOCUMENTS

| 10,242,019 | B1 * | 3/2019 | Shan .................. G06N 7/01 |
| 2012/0079594 | A1 * | 3/2012 | Jeong .................. G06F 21/57 726/23 |

* cited by examiner

*Primary Examiner* — Khai M Nguyen
(74) *Attorney, Agent, or Firm* — Studebaker & Brackett PC

(57) ABSTRACT

A method for compressing a behavior event and a computer device therefor are provided. The method for compressing the behavior event includes generating, by a processor of the computer, an event block on the basis of an event target, when the behavior event occurs, updating, by the processor, input/output (I/O) information while the behavior event occurs to the event block, and storing, by the processor, the event block, when the behavior event is ended.

20 Claims, 4 Drawing Sheets

METHOD FOR COMPRESSING BEHAVIOR EVENT IN COMPUTER AND COMPUTER DEVICE THEREFOR

CROSS-REFERENCE TO RELATED APPLICATIONS

A claim for priority under 35 U.S.C. § 119 is made to Korean Patent Application Nos. 10-2019-0169817 filed on Dec. 18, 2019 and 10-2020-0157671 filed on Nov. 23, 2020 in the Korean Intellectual Property Office, the entire contents of which are hereby incorporated by reference.

BACKGROUND

Embodiments of the inventive concept described herein relate to a method for compressing a behavior event in a computer and a computer device therefor, and more particularly, relate to a method for efficiently compressing a large amount of behavior events generated in the computer.

An existing technology is implemented in the form of collecting and storing a behavior event whenever a process, file, network, or registry event occurs, using a kernel driver or a technology such as user mode hooking to identify and track a behavior on the system.

When information is collected and stored whenever an I/O or a behavior occurs, there are many loads in performance of the system and the volume of collected data becomes considerably large. Thus, a very large amount of resources of the system are required for transmission or storage over a network.

Furthermore, because the volume of the collected data becomes large, many resources are needed to analyze data and generate statistical information of the data and it is difficult to efficiently analyze data.

Behavior events which occur in a personal computer (PC) may be thousands to tens of thousands of behavior events per second. A specific file I/O is exemplified as follows.

1. Open file
2. Write file
3. Read file
4. Chang file name
(Omitted)
7. Write file
9. Read file
10. Close file When collecting behavior information whenever the above behavior occurs, No. 10 event is collected for the file I/O above.

As an example, a document editor, such as PowerPoint, opens and edits one file to frequently store the files. In this case, thousands to tens of thousands of file events may be collected.

Thus, there is a need for developing a technology of efficiently compressing events in the computer.

SUMMARY

Embodiments of the inventive concept provide a method for compressing an event to efficiently collect a behavior event and tracking a behavior and a computer device therefor.

The inventive concept is not limited to the above-described problems and other problems which are not described herein will become apparent to those skilled in the art from the following description.

According to an exemplary embodiment, a method for compressing a behavior event, performed in a computer, may include generating, by a processor of the computer, an event block on the basis of an event target, when the behavior event occurs, updating, by the processor, input/output (I/O) information while the behavior event occurs to the event block, and storing, by the processor, the event block, when the behavior event is ended.

According to an exemplary embodiment, a method for compressing a behavior event, performed in a computer, may include generating, by a processor of the computer, metadata on the basis of an event target, when the behavior event occurs and adding, by the processor, another behavior event, which additionally occurs, to the metadata, when the other behavior event additionally occurs.

According to an exemplary embodiment, a computer device may include a processor and a memory storing a computer program configured to be executed by the processor. The computer program may perform a process of generating an event block on the basis of an event target, when a behavior event occurs, a process of updating I/O information while the behavior event occurs to the event block, and a process of storing the event block, when the behavior event is ended.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
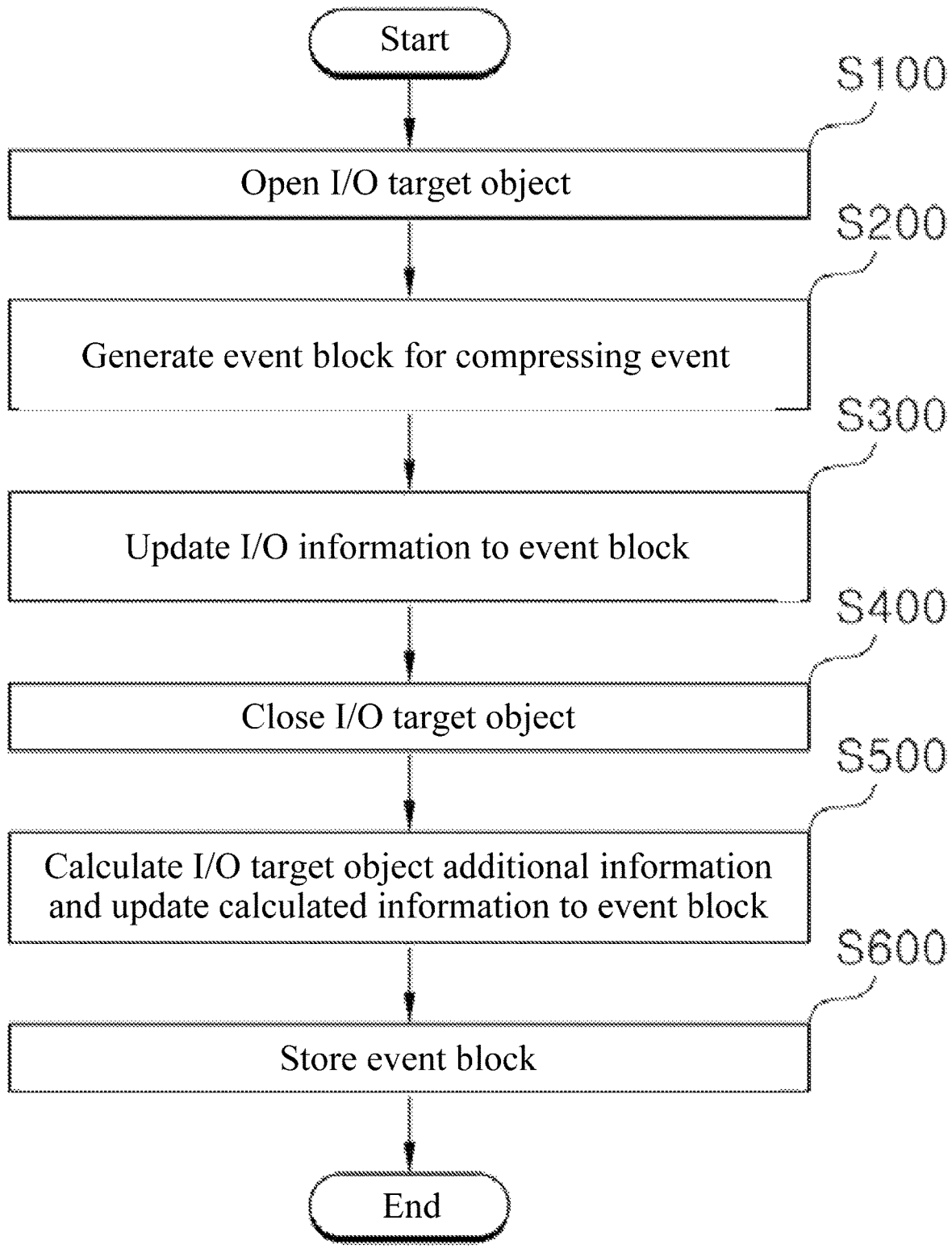
FIG. 1 is a flowchart illustrating in detail a method of compressing a behavior event according to an embodiment of the inventive concept.

Advantages and features disclosed in the specification, and methods of accomplishing the same will become apparent with reference to embodiments described in detail below together with the accompanying drawings. However, the specification is not limited by embodiments disclosed hereinafter, and may be implemented in various forms. Rather, these embodiments are provided to so that this disclosure will be through and complete and will fully convey the concept of the specification to those skilled in the art, and the scope of the specification will only be defined by the appended claims.

Terms used in the specification are used to describe embodiments and are not intended to limit the scope of the specification. In the specification, the terms of a singular form may include plural forms unless otherwise specified. The expressions "comprise" and/or "comprising" used herein indicate existence of one or more other elements other than stated elements but do not exclude presence of additional elements. Like reference numerals designate like elements throughout the specification, and the term "and/or" may include each of stated elements and one or more combinations of the stated elements. The terms such as "first" and "second" are used to describe various elements, but it is obvious that such elements are not restricted to the above terms. The above terms are used only to distinguish one element from the other. Thus, it is obvious that a first element described hereinafter may be a second element within the technical scope of the inventive concept.

Unless otherwise defined herein, all terms (including technical and scientific terms) used in the specification may be used as the same meaning that is generally understood by a person skilled in the art to which the specification pertains. Also, terms which are defined in a dictionary and commonly used should be interpreted as not in an idealized or overly formal detect unless expressly so defined. Hereinafter, an embodiment of the inventive concept will be described in detail with reference to the accompanying drawings.

Figure 2:
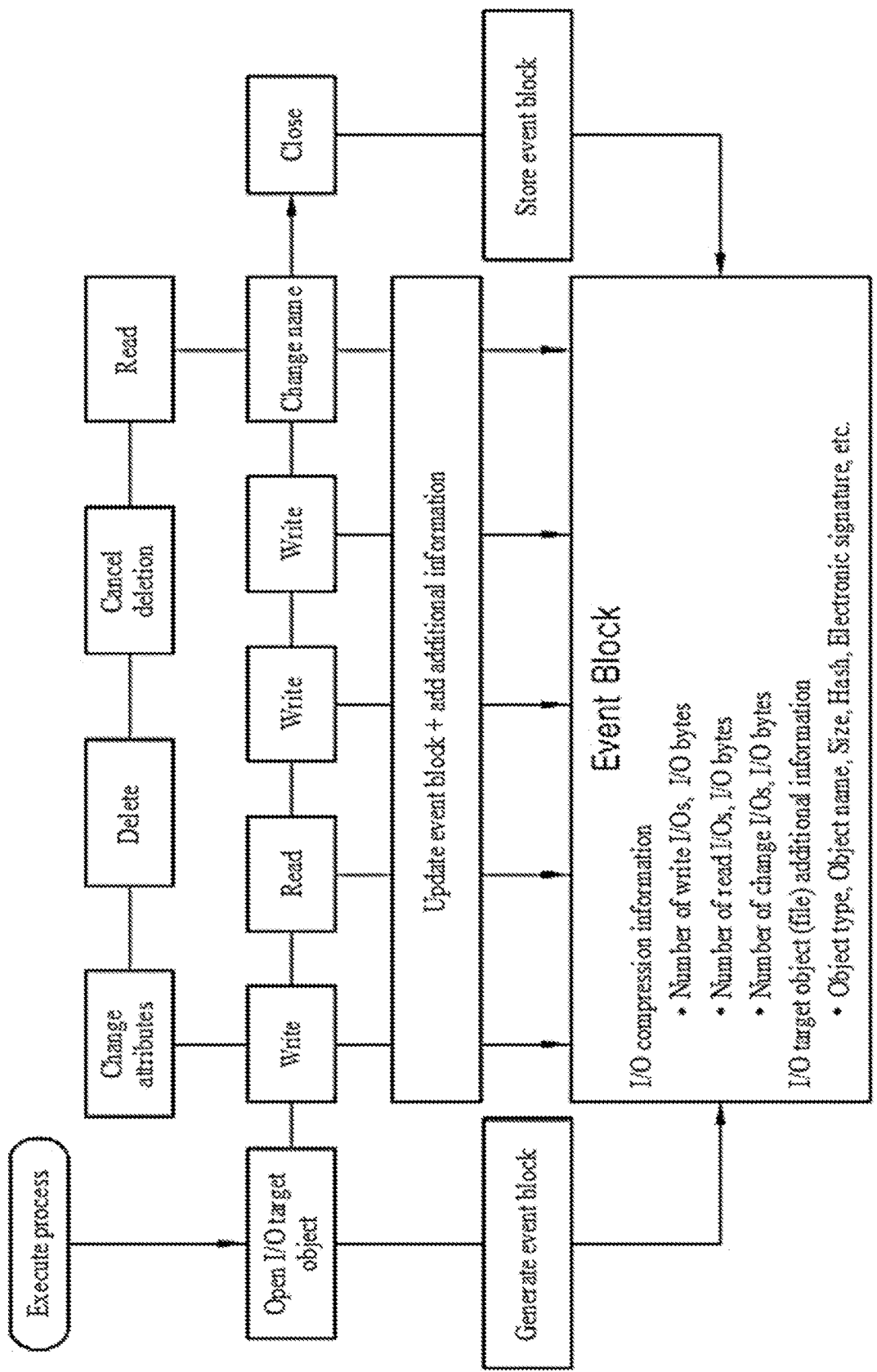
FIG. 2 is a block diagram illustrating the concept of a method for compressing a behavior event in FIG. 1.

FIG. 1 is a flowchart illustrating in detail a method of compressing a behavior event according to an embodiment of the inventive concept. FIG. 2 is a block diagram illustrating the concept of a method for compressing a behavior event in FIG. 1.

Referring to FIGS. 1 and 2, the method for compressing the behavior event may include opening (S100) an input/output (I/O) target object, generating (S200) an event block for compressing an event, updating (S300) I/O information to an event block, closing (S400) the I/O target object, calculating (S500) I/O target object additional information to update the calculated information to the event block, and storing (S600) the event block.

The opening (S100) of the I/O target object may include opening, by a processor, the I/O target object when a behavior event occurs.

The generating (S200) of the event block for compressing the event may be to generate the event block for compressing a behavior event, when the I/O target object is opened. The event block may be referred to as a container including I/O information, statistical information, and additional information from the beginning of the behavior event to the end of the behavior event.

The updating (S300) of the I/O information to the event block may be to update the I/O information while the behavior event occurs to the event block.

Referring to FIG. 2, rather than updating object information every time whenever an event, such as write, read, change name, change attributes, delete, or cancel, occurs with respect to an I/O target object, corresponding contents may accumulated and updated to a block to increase efficiency of information processing.

For example, statistical information about the number of I/Os to an object and statistical information about the number of I/O bytes may be updated on an event block.

For example, the number of I/Os and the number of I/O bytes for a write behavior, the number of I/Os and the number of I/O bytes for a read behavior, and the number of I/Os and the number of I/O bytes for a change behavior may be statistically processed separately to be updated on an event block.

The closing (S400) of the I/O target object may be to close the I/O target object at a time when an I/O is ended.

The calculating (S500) of the I/O target object additional information to update the calculated information to the event block may be to update object additional information to the event block at a time when the I/O target object is closed to update the object additional information only one time for each event, rather than updating the object additional information every time, thus improving efficiency of information processing.

The object additional information may include information about at least one of an object type, an object name, a size, hash, an electronic signature, or a change time.

The storing (S600) of the event block may be to store the event block after the update of the event block is completed and after the I/O target object is closed, and perform information processing of the target object only one time, thus saving a calculation load of a processor and considerably reducing the volume of the stored data.

Figure 3:
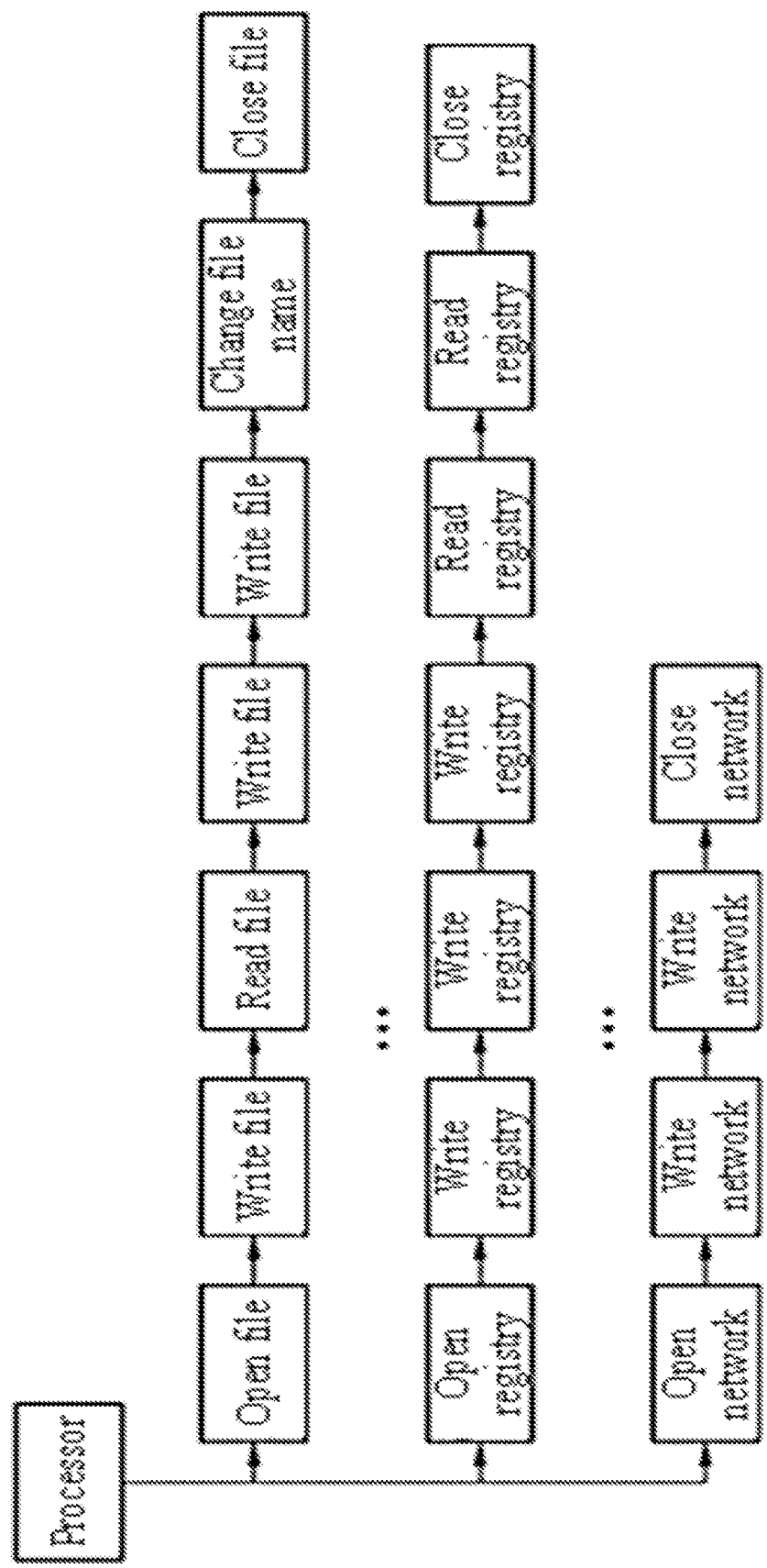
FIG. 3 is a block diagram illustrating the concept of processing according to an embodiment of the inventive concept.

FIG. 3 is a block diagram illustrating the concept of processing according to an embodiment of the inventive concept.

Referring to FIG. 3, in collecting a behavior event and an I/O event of a system, processing according to a comparison example may proceed in an order of calculating corresponding information, storing the information, and closing an I/O target object whenever an I/O is performed, for example, opening the I/O target object, reading the I/O target object, writing the I/O target object, and changing attributes of the I/O target object. At this time, because registry information and network information are processed together and because an event should be generated/recorded every time whenever a unit I/O is generated, performance may be degraded and data volume may become unnecessarily large.

When information (e.g., a size, hash, a change time, or the like) of a target object is processed using a behavior event block, one calculation is sufficient. However, because a processing technique according to a comparison example performs calculation every time for each unit I/O, system performance may be degraded and I/O data of the same object may be repeatedly stored.

Figure 4:
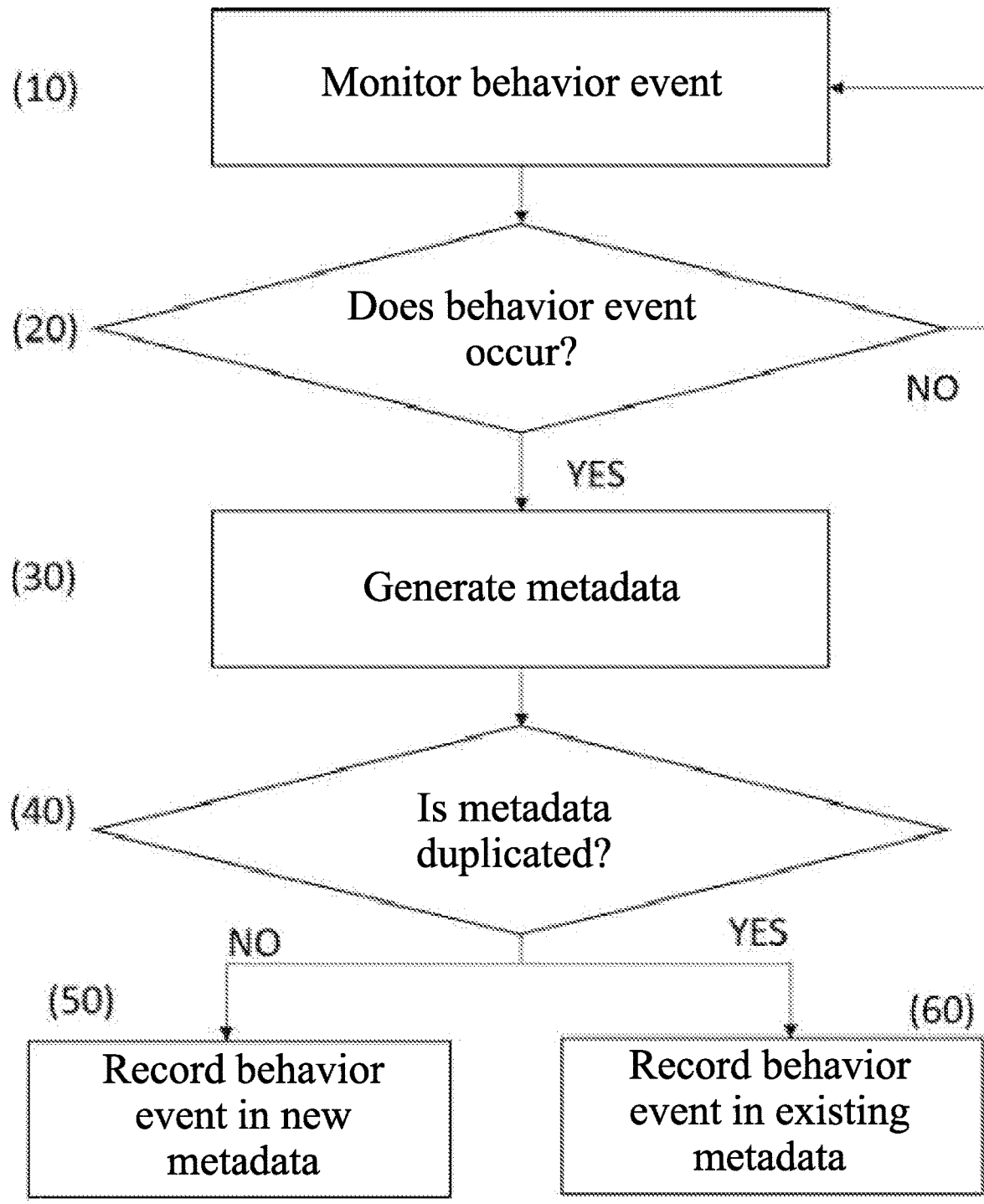
FIG. 4 is a flowchart illustrating a method for compressing a behavior event according to another embodiment of the inventive concept.

FIG. 4 is a flowchart illustrating a method for compressing a behavior event according to another embodiment of the inventive concept.

Referring to FIG. 4, in operation 10, a processor may monitor whether a behavior event occurs.

In operation 20, when the behavior event does not occur (NO' of operation 20), the processor may proceed to operation 10. Thus, operation 10 and operation 20 may be repeatedly performed.

On the other hand, in operation 20, when the behavior event occurs ('YES' of operation 20), the processor may proceed to operation 30. In operation 30, the processor may generate metadata on the basis of an event target.

The event target in the specification may refer to activity such as a file I/O, a registry I/O, transmission control protocol (TCP) network access, or user datagram protocol (UDP) network access.

In operation 40, the processor may determine whether the generated event target is duplicated with a target of metadata stored in a memory.

When the event target is not duplicated with the target of the metadata (NO' of operation 40), the processor may generate new metadata. Thus, the processor may proceed to operation 50 to record the behavior event in the metadata.

On the other hand, when the event target is duplicated with the target of the metadata ('YES' of operation 40), the processor may call previously generated metadata without generating metadata. The processor may delete the previously generated metadata without newly generating metadata. In operation 60, when another behavior event additionally occurs, the processor may add the other behavior event to the metadata.

The processor may add a behavior event, which additionally occurs, to metadata based on a time standard.

The method for compressing the behavior event according to the specification may be implemented in the form of a computer program, which is written to perform the respective operations and is stored in a computer-readable storage medium.

For the computer to read the program and execute the methods implemented with the program, the above-mentioned program may include a code coded into a computer language such as C/C++, C #, JAVA, Python, or a machine language readable through a device interface of the computer by a processor (CPU) of the computer. Such a code may include a functional code associated with a function and the like defining functions necessary for executing the methods and may include a control code associated with an execution procedure necessary for the processor of the computer to execute the functions according to a procedure. Further, such a code may further include a code associated with memory reference about whether additional information or media necessary for the processor of the computer to execute the functions is referred at any location (address number) of an internal or external memory of the computer. Further, if it is necessary for the processor of the computer to communicate with any computer or server located in a remote place to execute the functions, the code may further include a communication related code about how communication is performed with any computer or server located in a remote place using a communication module of the computer and whether to transmit and receive any information or media upon communication.

The medium may refer to a device-readable medium which stores data on a semipermanent basis rather than a medium, such as a register, a cache, or a memory, which stores data during a short moment. The medium may refer to a device-readable medium which stores data on a semipermanent basis rather than a medium, such as a register, a cache, or a memory, which stores data during a short moment. In other words, the program may be stored in various storage media on various servers accessible by the computer or various storage media on the computer of the user. Further, the medium may be distributed to a computer system connected over a network and may store a computer-readable code on a distributed basis.

According to an embodiment of the inventive concept, rather than updating object information every time whenever an event, such as write, read, change name, change attributes, delete, or cancel, occurs with respect to an I/O target object, corresponding contents may be accumulated and updated to an event block, thus increasing efficiency of information processing.

Furthermore, according to an embodiment of the inventive concept, object additional information may be updated to an event block at a time when an I/O target object is closed to update the object additional information only one time for each event rather than updating the object additional information every time, thus improving efficiency of information processing.

Furthermore, according to an embodiment of the inventive concept, metadata is generated to considerably reduce the amount of collected events.

The effects of the inventive concept are not limited to the above-described effects and other effects which are not described herein will become apparent to those skilled in the art from the following description.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for compressing a behavior event, performed in a computer, the method comprising:
    generating, by a processor of the computer, an event block on the basis of an event target, when the behavior event occurs;
    updating, by the processor, input/output (I/O) information while the behavior event occurs to the event block; and
    storing, by the processor, the event block, when the behavior event is ended.

2. The method of claim 1, wherein the generating is performed when the processor opens an I/O target object.

3. The method of claim 1, wherein the updating includes updating statistical information about the number of I/Os to a target object and statistical information about the number of I/O bytes.

4. The method of claim 1, wherein the storing includes calculating and storing object additional information of an I/O target.

5. The method of claim 4, wherein the object additional information includes information about at least one of an object type, an object name, a size, hash, an electronic signature, and a change time.

6. A method for compressing a behavior event, performed in a computer, the method comprising:
    generating, by a processor of the computer, metadata on the basis of an event target, when the behavior event occurs; and
    adding, by the processor, another behavior event, which additionally occurs, to the metadata, when the other behavior event additionally occurs.

7. The method of claim 6, wherein the generating includes determining, by the processor, whether the event target is duplicated with a target of metadata stored in a memory of the computer.

8. The method of claim 7, wherein the generating further includes generating, by the processor, new metadata, when the event target is not duplicated with the target of the metadata.

9. The method of claim 8, wherein the generating further includes calling, by the processor, previously generated metadata without generating the new metadata, when the event target is duplicated with the target of the metadata.

10. The method of claim 6, wherein the adding includes adding, by the processor, the other behavior event, which additionally occurs, to the metadata based on a time standard.

11. A computer device, comprising:
    a processor; and
    a memory storing a computer program configured to be executed by the processor,
    wherein the computer program performs a process of generating an event block on the basis of an event target, when a behavior event occurs, a process of updating I/O information while the behavior event occurs to the event block, and a process of storing the event block, when the behavior event is ended.

12. The computer device of claim 11, wherein the process of generating the event block is performed when opening an I/O target object.

13. The computer device of claim 11, wherein the process of updating the I/O information updates statistical information about the number of I/Os to a target object and statistical information about the number of I/O bytes.

14. The computer device of claim 11, wherein the process of storing the event block calculates and stores object additional information of an I/O target.

15. The computer device of claim 14, wherein the object additional information includes information about at least one of an object type, an object name, a size, hash, an electronic signature, and a change time.

16. The computer device of claim 11, wherein the computer program further performs a process of generating metadata on the basis of the event target, when the behavior event occurs, and a process of adding another behavior event, which additionally occurs, to the metadata, when the other behavior event additionally occurs.

17. The computer device of claim 16, wherein the process of generating the metadata determines whether the event target is duplicated with a target of metadata stored in a memory of the computer device.

18. The computer device of claim 17, wherein the process of generating the metadata generates new metadata, when the event target is not duplicated with the target of the metadata.

19. The computer device of claim 18, wherein the process of generating the metadata calls previously generated metadata without generating the new metadata, when the event target is duplicated with the target of the metadata.

20. The computer device of claim 16, wherein the process of adding the other behavior event adds the other behavior event, which additionally occurs, to the metadata based on a time standard.

\* \* \* \* \*